(12) United States Patent
Cheng et al.

(10) Patent No.: US 8,052,035 B2
(45) Date of Patent: Nov. 8, 2011

(54) METHOD AND MASK ASSEMBLY FOR FORMING SOLDER BODIES ON A SUBSTRATE

(75) Inventors: Chi-Hsiung Cheng, Tsao-Tun Chen (TW); Wan-Chen Chan, Nan-Tou (TW); Hsun-Fa Li, Tsao-Tun Chen (TW)

(73) Assignees: Universal Scientific Industrial (Shanghai) Co., Ltd., Shanghai (CN); Universal Global Scientific Industrial Co., Ltd., Nantou (TW)

( * ) Notice: Subject to any disclaimer, the term of this patent is extended or adjusted under 35 U.S.C. 154(b) by 859 days.

(21) Appl. No.: 11/898,245

(22) Filed: Sep. 10, 2007

(65) Prior Publication Data

US 2009/0022928 A1 Jan. 22, 2009

(30) Foreign Application Priority Data

Jul. 18, 2007 (TW) .............................. 96126143 A

(51) Int. Cl.
*B23K 31/00* (2006.01)
(52) U.S. Cl. .................................. 228/180.22; 228/215

(58) Field of Classification Search .................. 228/101, 228/180.22, 215; 438/613
See application file for complete search history.

(56) References Cited

U.S. PATENT DOCUMENTS

| 5,740,730 A * | 4/1998 | Thompson, Sr. ............... 101/127 |
| 2002/0146646 A1 * | 10/2002 | Jao et al. ........................ 430/312 |
| 2007/0090171 A1 * | 4/2007 | Ochiai et al. .................. 228/225 |

* cited by examiner

*Primary Examiner* — Jessica L Ward
*Assistant Examiner* — Nicholas D'Aniello
(74) *Attorney, Agent, or Firm* — Davidson Berquist Jackson & Gowdey, LLP

(57) ABSTRACT

A method for forming solder bodies on a substrate includes: positioning a first mask plate, which is formed with at least one first through-hole, on the substrate; filling the first through-hole with a first solder paste so as to form a first solder body on the substrate; positioning a second mask plate, which is formed with at least one second through-hole and at least one recess spaced apart from the second through-hole, on the substrate in such a manner that the first solder body is received in the recess; and filling the second through-hole with a second solder paste so as to form a second solder body on the substrate.

7 Claims, 8 Drawing Sheets

METHOD AND MASK ASSEMBLY FOR FORMING SOLDER BODIES ON A SUBSTRATE

BACKGROUND OF THE INVENTION

1. Field of the Invention

This invention relates to a mask assembly and a method using the mask assembly for forming solder bodies on a substrate.

2. Description of the Related Art

As shown in FIG. 1, Taiwanese Publication No. 518919 discloses a solder paste printing method including: positioning a mask plate 11, which is formed with a plurality of through-holes 111, on a circuit board 12; filling the through-holes 111 with a solder paste 14 using a printing squeegee 13; and removing the maskplate 11 from the circuit board 12.

Because of industrial requirements, two or more different solder pastes (e.g., tin-zinc solder material, tin-copper solder material, etc.) are required to be printed on the circuit board 12. Although the method described above can be employed to form solder bodies on many regions of the circuit board 12, only one kind of solder paste (referred as a "first solder paste" hereinafter) can be printed thereon using the aforesaid procedure. If the other kind of solder paste (referred as a "second solder paste" hereinafter) is to be applied to the circuit board 12, on which the solder bodies of the first solder paste have been formed, using the aforesaid procedure with a second mask plate, the solder bodies of the first solder paste are likely to be damaged by the second mask plate. Therefore, the current procedure for applying a second solder paste to the circuit board cannot be conducted by the aforesaid printing techniques and can only be conducted by manually forming the solder bodies one at a time, thereby resulting in waste of time and manpower.

Therefore, there is a need in the art to provide a method and a mask assembly that can permit application of two different kinds of solder pastes to a substrate using a conventional printing apparatus.

SUMMARY OF THE INVENTION

Therefore, the object of the present invention is to provide a method and a mask assembly that can overcome the aforesaid drawback of the prior art.

According to one aspect of the present invention, there is provided a method for forming solder bodies on a substrate. The method includes: positioning a first mask plate, which is formed with at least one first through-hole, on the substrate; filling the first through-hole with a first solder paste so as to form a first solder body on the substrate; positioning a second maskplate, which is formed with at least one second through-hole and at least one recess spaced apart from the second through-hole, on the substrate in such a manner that the first solder body is received in the recess; and filling the second through-hole with a second solder paste so as to form a second solder body on the substrate.

According to another aspect of the present invention, there is provided a mask assembly for forming solder bodies on first and second solder-forming regions of a substrate. The mask assembly includes: a first mask plate formed with at least one first through-hole that is adapted to be aligned with the first solder-forming region of the substrate when the first mask plate is stacked on the substrate; and a second mask plate formed with at least one second through-hole that is adapted to be aligned with the second solder-forming region of the substrate when the second mask plate is stacked on the substrate, and a recess that is spaced apart from the second through-hole, that is adapted to be aligned with the first solder-forming region of the substrate when the second mask plate is stacked on the substrate, and that has a size greater than that of the first through-hole.

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF THE PREFERRED EMBODIMENTS

Figure 1:
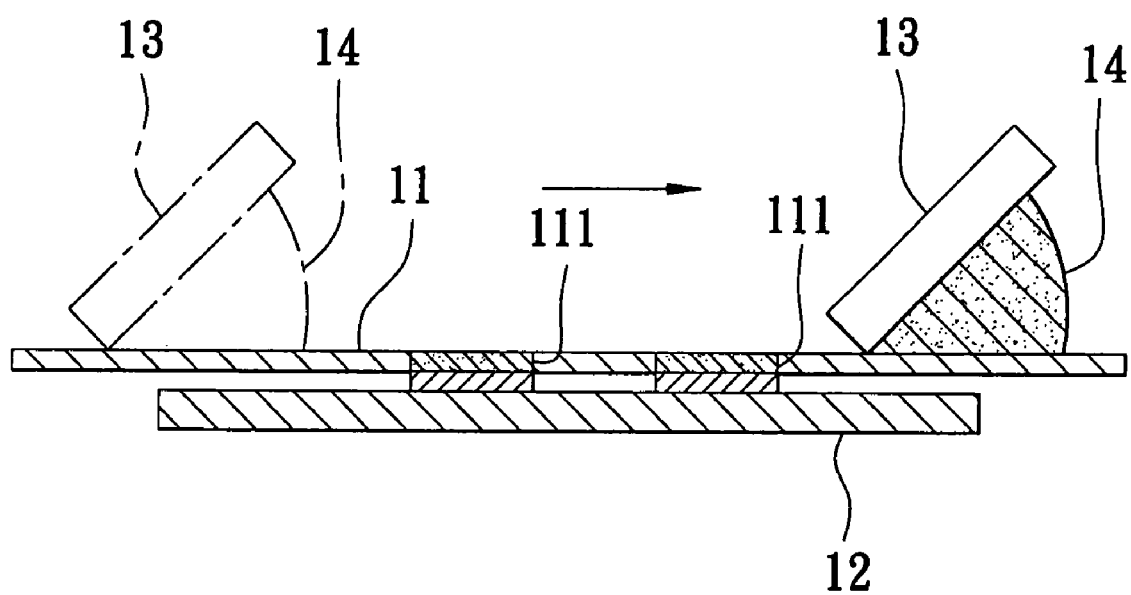
FIG. 1 is a schematic cross-sectional view illustrating a conventional method for forming a solder body on a circuit board.
Figure 2:
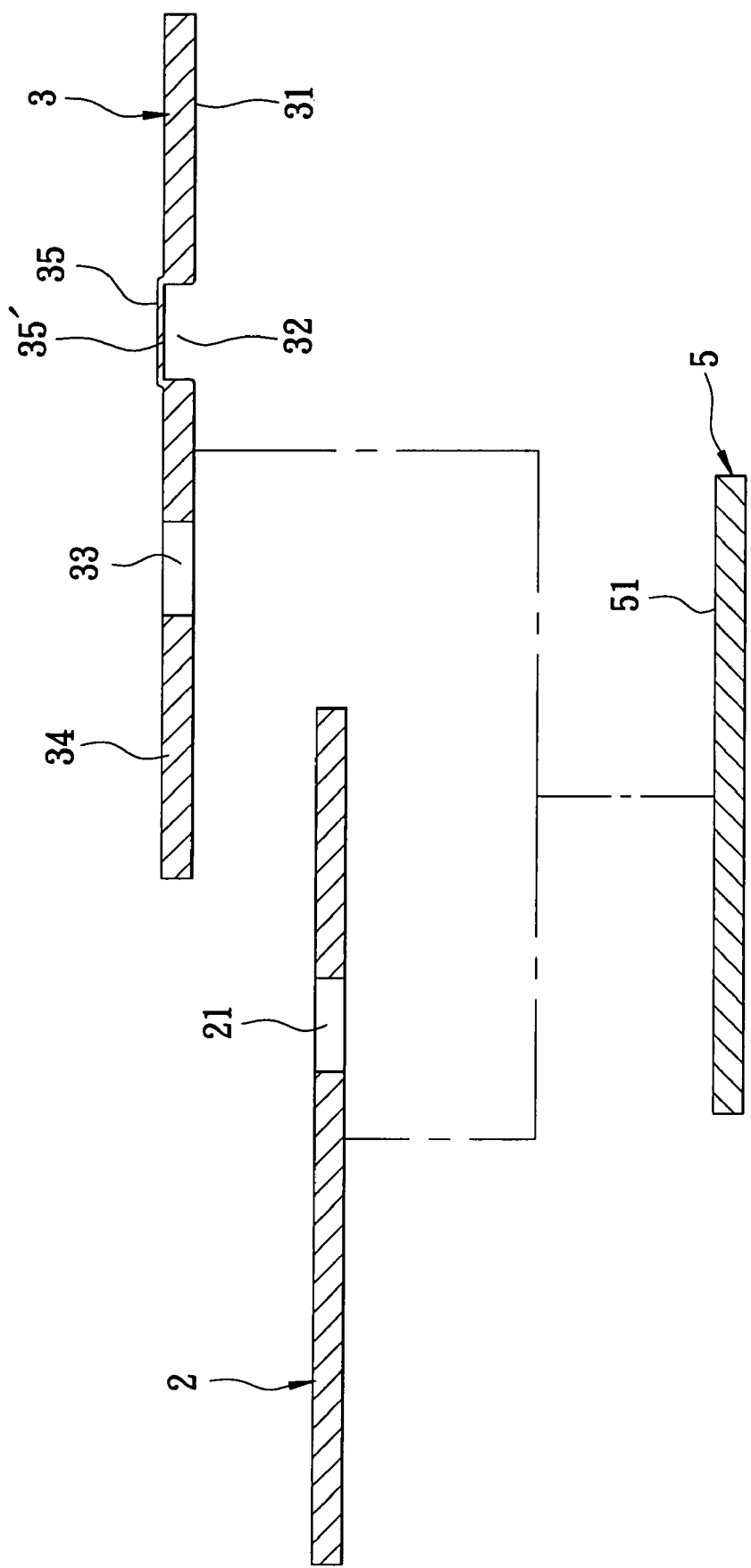
FIG. 2 is a cross-sectional view of the preferred embodiment of a metal mask assembly according to this invention.

Referring to FIG. 2, the preferred embodiment of a mask assembly for forming solder bodies on first and second solder-forming regions 52, 53 (see FIG. 6) of a substrate 5 according to the present invention is shown to include: a first mask plate 2 formed with at least one first through-hole 21, and a second mask plate 3 including an upper surface 34 and a lower surface 31, and formed with at least one second through-hole 33 and at least one recess 32 indented from the lower surface 31. The first through-hole 21 is adapted to be aligned with the first solder-forming region 52 of the substrate 5 when the first mask plate 2 is stacked on the substrate 5 (see FIG. 3). The second through-hole 33 in the second mask plate 3 is adapted to be aligned with the second solder-forming region 53 of the substrate 5 when the second mask plate 3 is stacked on the substrate 5 (see FIG. 6). The recess 32 has a closed end 35' disposed adjacent to the upper surface 34 and defined by a closing wall 35 (see FIG. 6), and is laterally spaced apart from the second through-hole 33. The recess 32 is adapted to be aligned with the first solder-forming region 52 of the substrate 5 when the second mask plate 3 is stacked on the substrate 5, and has a size greater than that of the first through-hole 21. It should be noted that the number of the recess 32 is identical to or greater than that of the first through-hole 21.

FIGS. 3 to 8 show consecutive steps of a method for forming the solder bodies on the first and second solder-forming regions 52, 53 of the substrate 5 using the mask assembly according to the present invention.

Figure 3:
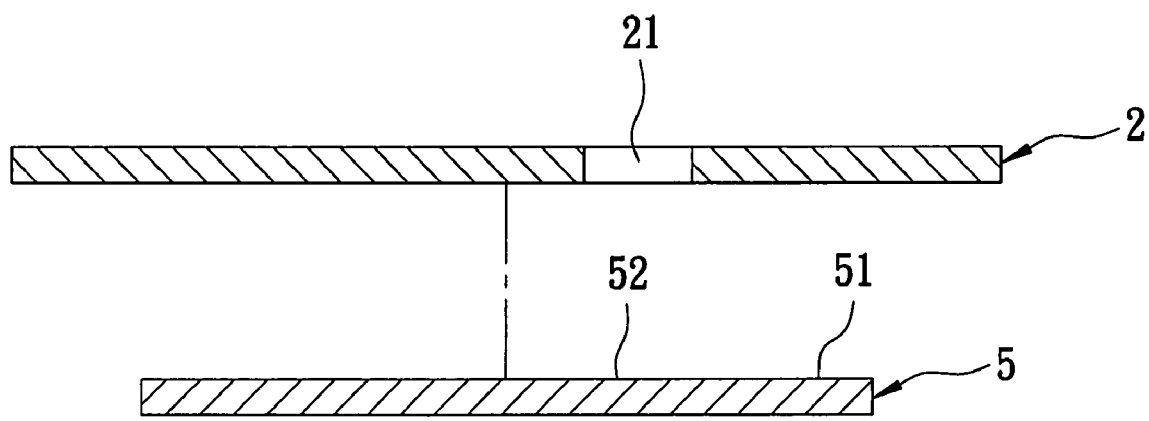
FIGS. 3 to 8 are schematic cross-sectional views illustrating consecutive steps of the preferred embodiment of a method for forming solder bodies on a substrate according to this invention.

As shown in FIG. 3, the first mask plate 2 formed with the first through-hole 21 is positioned on a solder-forming surface 51 of the substrate 5. As described above, the first through-hole 21 is aligned with the first solder-forming region 52 of the substrate 5.

Figure 4:
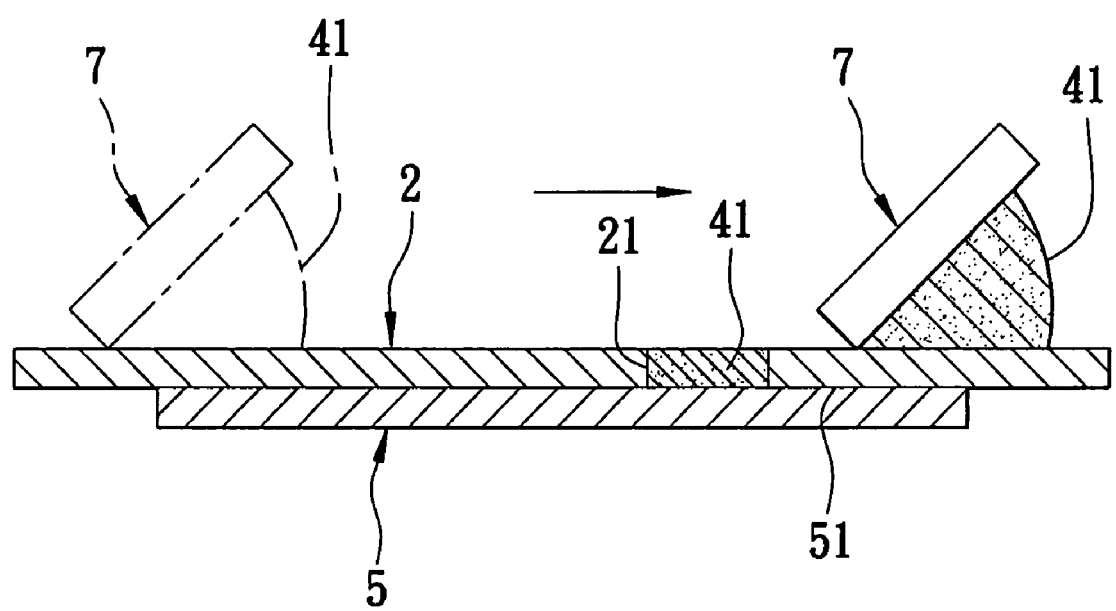

As shown in FIG. 4, a first solder paste 41 is applied to the first maskplate 2. Subsequently, a printing squeegee 7 is placed and is moved on the first mask plate 2 from one end thereof to the other end so as to fill the first through-hole 21 with the first solder paste 41, thereby forming a first solder body 41' (see FIG. 5) on the solder-forming surface 51 of the substrate 5.

Figure 5:
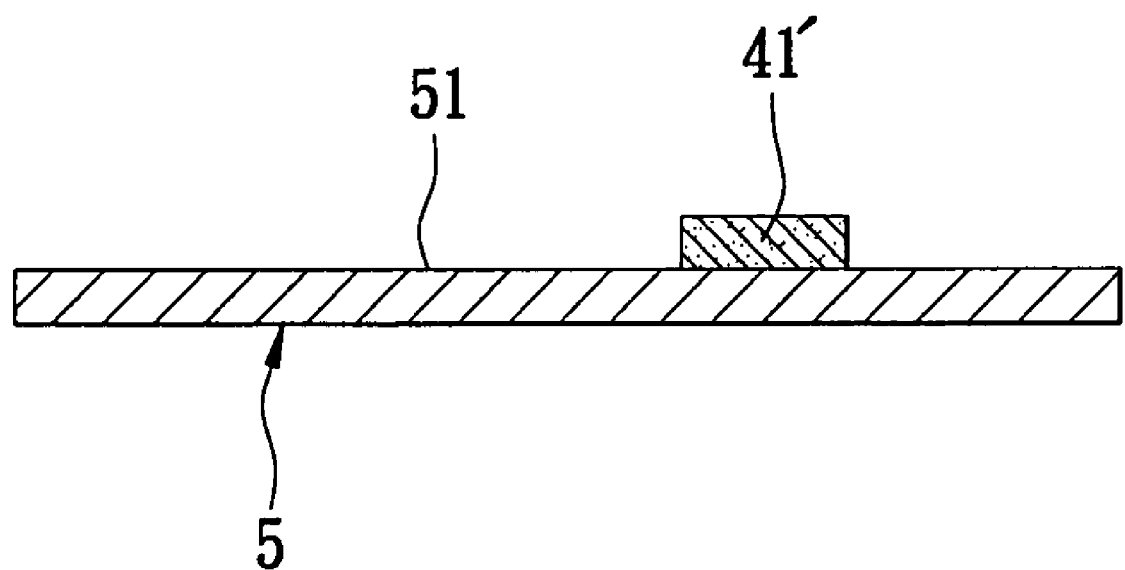

As shown in FIG. 5, the first mask plate 2 is removed after formation of the first solder body 41' on the surface 51 of the substrate 5.

Figure 6:
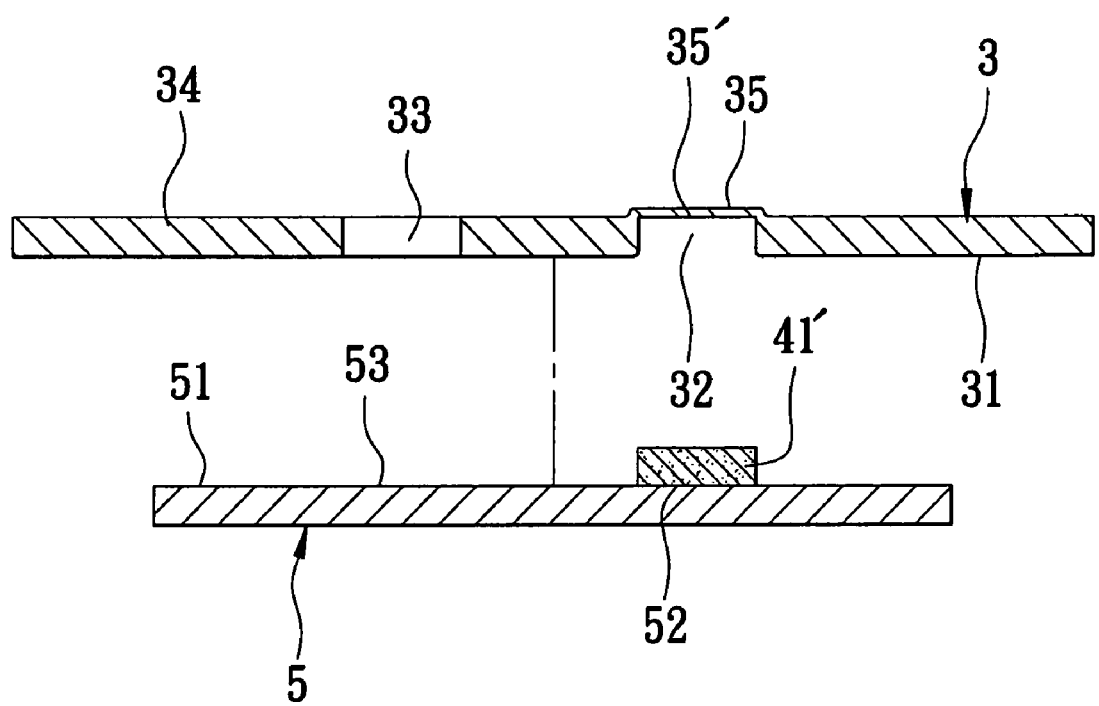

Subsequently, as shown in FIG. 6, the second maskplate 3 formed with the second through-hole 33 and the recess 32 is positioned on the solder-forming surface 51 of the substrate 5 in such a manner that the first solder body 41' is received in the recess 32. As described above, the second through-hole 33 is aligned with the second solder-forming region 53 of the substrate 5. In addition, the closing wall 35 that defines the closed end 35' of the recess 32 protects the first solder body 41' formed on the first solder-forming region 52 of the substrate 5 from being damaged by the second mask plate 3 when the second mask plate 3 is stacked on the substrate 5.

Figure 7:
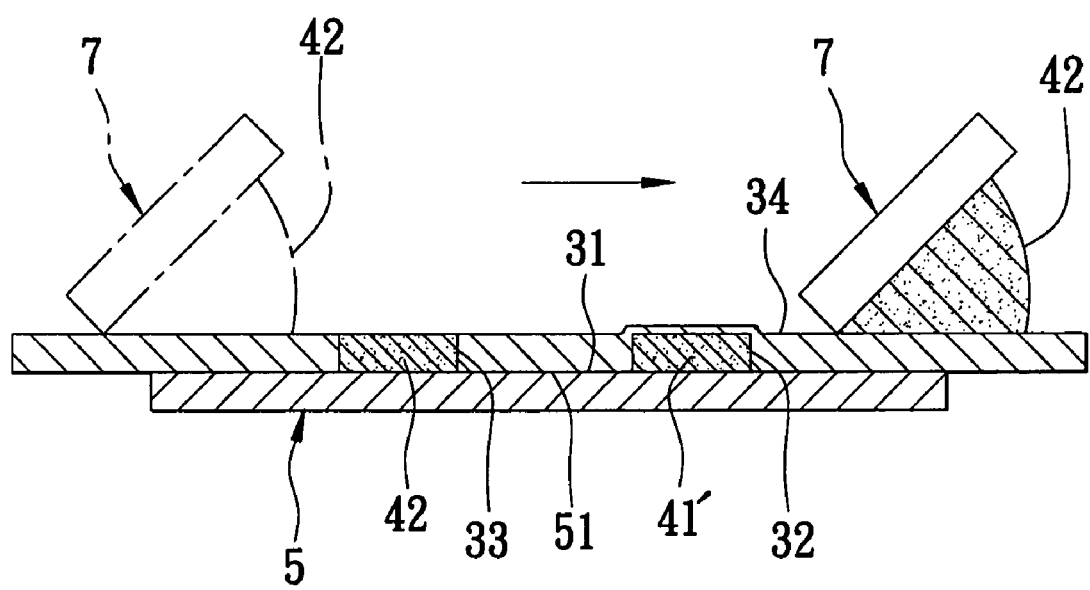

A second solder paste 42 is then applied to the second mask plate 3 and is subsequently moved into the second through-hole 33 by moving the printing squeegee 7 on the second mask plate 3 (see FIG. 7).

Figure 8:
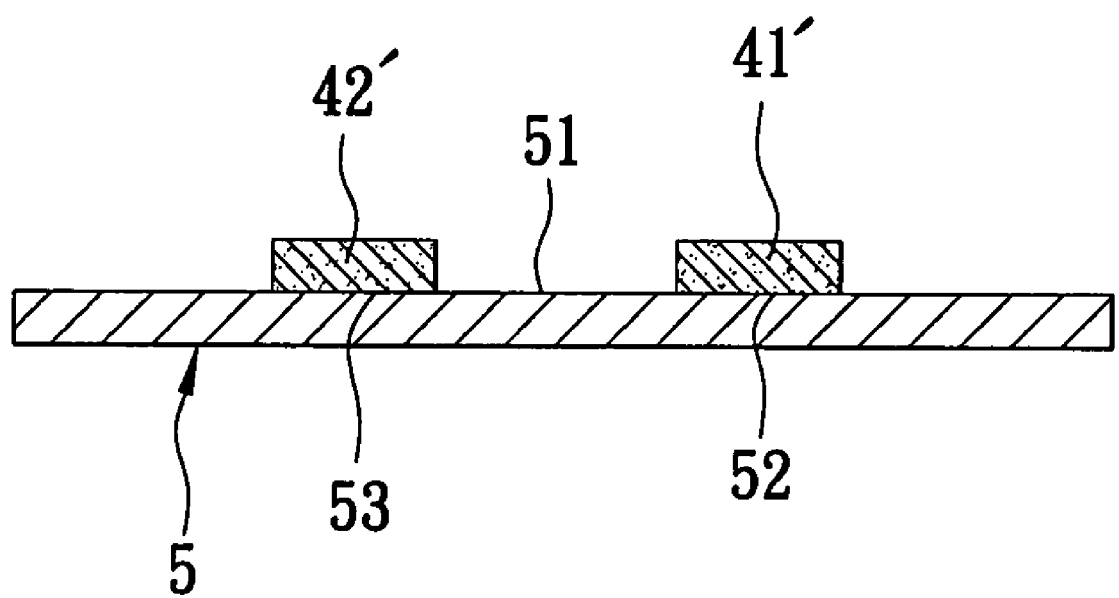

After removing the second mask plate 3, the substrate 5 formed with the first solder body 41' of the first solder paste 41 and the second solder body 42' of the second solder paste 42 is obtained (see FIG. 8).

With the inclusion of the mask assembly in the method of this invention, solder bodies made from two different solder pastes can be formed on the same surface of the substrate using the printing apparatus in a conventional manner, thereby resulting in a decrease in manufacturing time and labor expenses.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A method for forming solder bodies on a substrate, comprising:

positioning a first mask plate, which is formed with at least one first through-hole, on the substrate;

filling the first through-hole with a first solder paste so as to form a first solder body on the substrate;

positioning a second mask plate, which has upper and lower surfaces and which is formed with at least one second through-hole and at least one recess spaced apart from the second through-hole, on the substrate in such a manner that the first solder body is received in and protected by the recess, wherein the recess is indented from the lower surface, and has a closed end disposed adjacent to the upper surface and defined by a closing wall, the closing wall protruding from the upper surface;

filling the second through-hole with a second solder paste so as to form a second solder body on the substrate while the first solder body is received in and protected by the recess; and removing the second mask plate from the substrate.

2. The method of claim 1, wherein formation of each of the first and second solder bodies is conducted by solder paste printing techniques.

3. The method of claim 1, wherein the first solder paste and the second solder paste are two different solder pastes.

4. The method of claim 1, wherein the lower surface of the second mask plate is positioned adjacent the substrate while filling the second through-hole.

5. The method of claim 1, wherein the recess is indented in a shape generally the same as the first solder body.

6. The method of claim 1, wherein the recess is indented to closely mate the first solder body such that the closed end is aligned over the first solder body while filling the second through-hole.

7. The method of claim 1, wherein a depth of the recess from the lower surface to the closing wall is at least equal to a distance between the upper and lower surfaces of the second mask plate.

* * * * *